(12) United States Patent
Binder et al.

(10) Patent No.: US 12,356,762 B2
(45) Date of Patent: Jul. 8, 2025

(54) OPTOELECTRONIC COMPONENT AND METHOD FOR PRODUCING AN OPTOELECTRONIC COMPONENT

(71) Applicant: OSRAM Opto Semiconductors GmbH, Regensburg (DE)

(72) Inventors: Michael Binder, Barbing (DE); Andreas Rückerl, Konzell (DE); Roland Zeisel, Tegernheim (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 678 days.

(21) Appl. No.: 17/774,870

(22) PCT Filed: Oct. 21, 2020

(86) PCT No.: PCT/EP2020/079658
§ 371 (c)(1),
(2) Date: Sep. 20, 2022

(87) PCT Pub. No.: WO2021/089330
PCT Pub. Date: May 14, 2021

(65) Prior Publication Data
US 2023/0125745 A1  Apr. 27, 2023

(30) Foreign Application Priority Data
Nov. 7, 2019  (DE) ............... 10 2019 217 228.8

(51) Int. Cl.
*H10H 20/816* (2025.01)
*H01L 25/075* (2006.01)
(Continued)

(52) U.S. Cl.
CPC ..... *H10H 20/8162* (2025.01); *H01L 25/0753* (2013.01); *H10H 20/0137* (2025.01);
(Continued)

(58) Field of Classification Search
CPC ........... H10H 20/8162; H10H 20/0137; H10H 20/062; H10H 20/8314; H10H 20/84;
(Continued)

(56) References Cited

U.S. PATENT DOCUMENTS

2003/0070274 A1  4/2003  Ohba et al.
2003/0189829 A1  10/2003  Shimizu et al.
(Continued)

FOREIGN PATENT DOCUMENTS

CN  108269894 A  7/2018
JP  S52012555 B  4/1977
(Continued)

OTHER PUBLICATIONS

Japanese Decision to Grant a Patent issued for the corresponding JP patent application No. JP 2022-526121, dated Nov. 2, 2023, 2 pages.
(Continued)

*Primary Examiner* — Mark W Tornow
(74) *Attorney, Agent, or Firm* — Viering, Jentschura & Partner mbB

(57) ABSTRACT

An optoelectronic component may include a support and multiple optoelectronic semiconductor chips that can be actuated individually and independently of one another. Each semiconductor chip may include a semiconductor layer sequence. Each semiconductor chip may have an electrically insulating passivation layer on the respective lateral surface of the semiconductor layer sequence. The semiconductor chip(s) are assigned to a first group, which may be paired with a common boundary field generating device arranged on the passivation layer face facing away from the semiconductor layer sequence at an active zone for each semiconductor chip of the first group. The boundary field generating device is designed to at least temporarily generate an electric field in the boundary regions of the active zone so
(Continued)

that a flow of current through the semiconductor layer sequences can be controlled in the boundary regions during the operation of the semiconductor chips of the first group.

13 Claims, 7 Drawing Sheets

(51) Int. Cl.
*H10H 20/00* (2025.01)
*H10H 20/01* (2025.01)
*H10H 20/831* (2025.01)
*H10H 20/84* (2025.01)
*H10H 20/857* (2025.01)

(52) U.S. Cl.
CPC ...... *H10H 20/062* (2025.01); *H10H 20/8314* (2025.01); *H10H 20/84* (2025.01); *H10H 20/857* (2025.01); *H10H 20/032* (2025.01); *H10H 20/034* (2025.01); *H10H 20/0364* (2025.01)

(58) Field of Classification Search
CPC .. H10H 20/857; H10H 20/032; H10H 20/034; H10H 20/0364; H10H 20/816; H01L 25/0753
See application file for complete search history.

(56) References Cited

U.S. PATENT DOCUMENTS

| | | |
|---|---|---|
| 2006/0011972 A1 | 1/2006 | Graham et al. |
| 2009/0267049 A1* | 10/2009 | Cho ............... H10H 20/818 438/47 |
| 2009/0267096 A1 | 10/2009 | Kim |
| 2018/0190861 A1 | 7/2018 | Lee et al. |
| 2018/0287027 A1* | 10/2018 | Chaji ............... H01L 25/167 |
| 2019/0013306 A1* | 1/2019 | Wu ............... H01L 25/0753 |
| 2019/0035974 A1 | 1/2019 | Li et al. |
| 2019/0148409 A1 | 5/2019 | Bang |
| 2019/0157341 A1 | 5/2019 | Chang et al. |
| 2020/0044117 A1* | 2/2020 | Vierheilig ......... H10H 20/0133 |

FOREIGN PATENT DOCUMENTS

| | | |
|---|---|---|
| JP | S63313887 A | 12/1988 |
| JP | 2003051621 A | 2/2003 |
| JP | 2009267418 A | 11/2009 |
| JP | 2019091000 A | 6/2019 |
| WO | 3016782 A1 | 2/2003 |
| WO | 2004040667 A1 | 5/2004 |
| WO | 2018192879 A1 | 10/2018 |

OTHER PUBLICATIONS

International Search Report issued for the corresponding international patent application No. PCT/EP2020/079658, dated Jan. 26, 2021, 4 pages.
German Search Report issued for the corresponding German patent application No. 10 2019 217 228.8, dated Jul. 14, 2020, 5 pages.

* cited by examiner

OPTOELECTRONIC COMPONENT AND METHOD FOR PRODUCING AN OPTOELECTRONIC COMPONENT

CROSS-REFERENCE TO RELATED APPLICATION

The present application is a national stage entry according to 35 U.S.C. § 371 of PCT application No.: PCT/EP2020/079658 filed on Oct. 21, 2020, which claims priority to German Patent Application Serial No.: 10 2019 217 228.8 filed on Nov. 7, 2019; both of which are incorporated herein by reference in their entirety and for all purposes.

TECHNICAL FIELD

An optoelectronic component and a method for producing optoelectronic component are specified.

BACKGROUND

An object to be achieved consists in specifying an optoelectronic component with a high and stable efficiency, especially at low current densities. A further object to be achieved consists in specifying a method for producing such an optoelectronic component.

SUMMARY

The optoelectronic component is specified first. By way of example, the optoelectronic component is an LED arrangement, in particular a 2-D LED arrangement (LED array) or a module of a video screen. By way of example, the component can be used in a headlamp for a motor vehicle or in the background lighting in a cellular telephone or in room lighting or in a monitor.

The optoelectronic component comprises a carrier according to at least one embodiment. The carrier may be self-supporting and forms the component part that stabilizes the component. By way of example, the carrier is a semiconductor carrier or a ceramic carrier or a glass carrier or a plastic carrier, for example a PCB.

According to at least one embodiment, the optoelectronic component comprises a plurality of individually and independently actuatable optoelectronic semiconductor chips on the carrier. In particular, the semiconductor chips are LED chips configured to emit radiation. The component may comprise at least 10 or at least 100 or at least 10 000 optoelectronic semiconductor chips. The semiconductor chips are arranged next to one another on a top side of the carrier.

Here and below, a semiconductor chip is understood to mean a separately manageable and electrically contactable element. A semiconductor chip arises, in particular, by singulation from a wafer assemblage. In particular, side faces of a semiconductor layer sequence of a semiconductor chip then have traces from the singulation process, for example. A semiconductor chip may include exactly one originally contiguous region of the semiconductor layer sequence grown in the wafer assemblage. The semiconductor layer sequence of the semiconductor chip may have a contiguous form. Since the semiconductor chips arise by singulation, the semiconductor layer sequences of the semiconductor chips are not (no longer) contiguous.

The semiconductor chips are individually actuatable and actuatable independently of one another. That is to say, each semiconductor chip can be activated and deactivated without all other semiconductor chips or any other semiconductor chip on the carrier being activated or deactivated.

According to at least one embodiment, each semiconductor chip comprises a semiconductor layer sequence with an n-doped layer, a p-doped layer and an active zone. The active zone is configured to produce radiation by means of electroluminescence and is arranged between the p-doped layer and the n-doped layer. Further, the semiconductor layer sequence of each semiconductor chip has at least one side face which extends at an angle to the active zone, that is to say at an angle to the plane of principal extent of the active zone. In particular, "at an angle" means that the side face does not extend parallel to the active zone. By way of example, the side face and the active zone include an angle of at least 30° or at least 45° or at least 70° or of approximately 90° or more than 90° in between one another.

The side face delimits the semiconductor layer sequence in a lateral direction, a lateral direction being a direction parallel to the plane of principal extent of the active zone. The active zone may adjoin the side face(s). The same may also apply to the n-doped layer and p-doped layer.

In a non-limiting embodiment, each semiconductor chip comprises a plurality of side faces, by means of which the associated semiconductor layer sequence is delimited in all lateral directions. By way of example, the semiconductor layer sequence comprises four side faces. In a non-limiting embodiment, the semiconductor layer sequence comprises a main emission face in addition to the at least one side face, for example at least 50% or at least 75% of the produced radiation being output coupled from the semiconductor layer sequence via said main emission surface while the semiconductor chip is in operation. The main emission surface extends at an angle or perpendicular to the side face or side faces, and faces away from the carrier, for example. By way of example, an edge length of the main emission face is no more than 40 µm or no more than 20 µm. The ratio of area to perimeter of the main emission surface may be no more than 10 µm or no more than 5 µm.

According to at least one embodiment, each semiconductor chip comprises a p-electrode and an n-electrode for electrically contacting the p-doped layer and the n-doped layer. The p-electrode and the n-electrode may be ohmically conductive and are based on a different material system to the semiconductor layer sequence. By way of example, the p-electrode and the n-electrode are made of one or more metals and/or of one or more transparent conductive oxides, abbreviated TCO. The n-electrode is in electrical and mechanical contact with the n-doped layer, and the p-electrode is in electrical and mechanical contact with the p-doped layer.

The semiconductor layer sequences of the semiconductor chips may be based on a III-V compound semiconductor material. The semiconductor material is, for example, a nitride compound semiconductor material such as $Al_nIn_{1-n-m}Ga_mN$ or a phosphide compound semiconductor material such as $Al_nIn_{1-n-m}Ga_mP$ or else an arsenide compound semiconductor material such as $Al_nIn_{1-n-m}Ga_mAs$ or such as $Al_nGa_mIn_{1-n-m}As_kP_{1-k}$, where $0 \le n \le 1$, $0 \le m \le 1$ and $n+m \le 1$ and $0 \le k < 1$ in each case. In a non-limiting embodiment, $0 \le n \le 0.8$, $0.4 \le m < 1$ and $n+m \le 0.95$ and $0 < k \le 0.5$ applies for at least one layer or for all layers of the semiconductor layer sequence. The semiconductor layer sequence may include dopants and additional constituents. However, for simplicity only the key constituents of the crystal lattice of the semiconductor layer sequence, that is to say Al, As, Ga, In, N or P, are specified, even though these may be partly replaced and/or supplemented by small amounts of other substances.

The active zones of the semiconductor chips may each be configured to produce electromagnetic radiation with a wavelength of maximum intensity of at least 360 nm or 420 nm and/or of at most 860 nm or 560 nm or 480 nm. Incoherent radiation may be produced. The active zones in particular each contain at least one pn-transition and/or at least one quantum well structure in the form of a single quantum well, abbreviated SQW, or in the form of a multi-quantum well structure, abbreviated MQW. Each semiconductor chip may include exactly one contiguous active zone. The active zones for example each comprise a mean thickness between 5 nm and 5000 nm inclusive, as measured perpendicular to the plane of principal extent of the active zone.

According to at least one embodiment, the semiconductor chips each have an electrically insulating passivation layer at/on the respective side face of the semiconductor layer sequence. For each semiconductor chip, the passivation layer may cover-all side faces of the semiconductor layer sequence, to at least 50% or to at least 75% or to at least 90% or in full in each case. The passivation layers of the semiconductor chips may each be formed in contiguous fashion and without interruptions. The passivation layers of the semiconductor chips or of some semiconductor chips may be contiguous. The passivation layers consist of a dielectric material, for example an oxide such as silicon oxide, or a nitride such as silicon nitride, or a glass.

According to at least one embodiment, at least some of the semiconductor chips are assigned to a first group. All semiconductor chips of the component may be assigned to the first group. Thus, the first group is a group of semiconductor chips.

According to at least one embodiment, a common edge field generation device is assigned to the semiconductor chips of the first group. This edge field generation device is arranged on a side of the passivation layer facing away from the semiconductor layer sequence for each semiconductor chip of the first group. In particular, each semiconductor chip of the first group is surrounded by the edge field generation device. By way of example, when considered in a plan view, the edge field generation device surrounds the active zone of each semiconductor chip of the first group to at least 90% or in full.

The edge field generation device may be arranged level with the active zones of the semiconductor chips in each case. In particular, the edge field generation device is arranged directly on the passivation layer of each semiconductor chip of the first group. In particular, the edge field generation device has a contiguous form. By way of example, the edge field generation device is a contiguous layer/layer sequence or a contiguous molded body, which is applied to all side faces of the semiconductor chips of the first group.

The edge field generation device being arranged level with the active zones means that, for instance, the edge field generation device in each case partly or completely covers the active zones in a plan view on the side faces. In a non-limiting embodiment, the edge field generation device in each case largely covers the side faces of the associated semiconductor layer sequence, for example to at least 50% or to at least 75% or to at least 95%.

According to at least one embodiment, the edge field generation device is configured to generate an electric field at least intermittently in edge regions of the active zones of the semiconductor chips of the first group such that a current flow through the semiconductor layer sequences is controllable in the edge regions when the semiconductor chips of the first group are in operation. In each semiconductor chip, the edge region may partly or completely surround the semiconductor chip. In particular, the electric field is generated by virtue of the edge field generation device being permanently electrically charged or having a permanent electric charge distribution or by virtue of being intermittently or permanently brought to an electric potential that differs from zero. The electric field proceeds from the edge field generation device, penetrates through the passivation layers and reaches into the semiconductor layer sequences and the active zones.

A current flow through the semiconductor layer sequences is rendered controllable or able to be influenced in the edge regions by way of the edge field generation device. The edge field generation device may reduce or suppress a current flow in the edge regions in comparison with a structurally identical semiconductor chip without an edge field generation device. Especially in the case of low current densities, there is an excessive current flow and possibly increased charge carrier recombination on account of diffusion directly against the passivation layer if there is no edge field generation device, this being able to be traced back to the band structure of the semiconductor layer sequence. This excessive current flow or this excessive charge carrier recombination may be reduced to such an extent by the edge field generation device that a current density/charge carrier recombination in the edge region is the same as or approximately the same as or less than a current density/charge carrier recombination in a central region of the active zone. That is to say, the edge field generation device renders a current flow, and hence a charge carrier recombination, controllable or regulable or adjustable, in particular reducible, in the edge region in the active zone.

This renders leakage currents and unwanted recombination paths manipulable at the edge region, especially at low current densities. Moreover, it is possible to set an area of the active zone in which charge carrier recombination, and hence light production, occurs by way of actuating the edge field generation device. In particular, the electric fields keep charge carriers that are responsible for the leakage current, that is to say electrons and holes, away from the side faces.

In at least one embodiment, the optoelectronic component comprises a carrier and a plurality of individually and independently actuatable optoelectronic semiconductor chips on the carrier. Each semiconductor chip comprises a semiconductor layer sequence having an n-doped layer, a p-doped layer, an active zone for producing radiation by means of electroluminescence between the p-doped layer and the n-doped layer and a side face which extends at an angle to the active zone and delimits the semiconductor layer sequence in a lateral direction. Further, each semiconductor chip comprises a p-electrode and an n-electrode for electrically contacting the p-doped layer and the n-doped layer. The semiconductor chips each have an electrically insulating passivation layer on the respective side face of the semiconductor layer sequence. At least some of the semiconductor chips are assigned to a first group. The semiconductor chips of the first group are assigned a common edge field generation device, the latter being arranged level with the active zone on a side of the passivation layer facing away from the semiconductor layer sequence for each semiconductor chip of the first group. The edge field generation device is configured to generate an electric field at least intermittently in edge regions of the active zones such that a current flow through the semiconductor layer sequences is controllable in the edge regions while the semiconductor chips of the first group are in operation.

LED chips, for example InGaN-LED chips, may exhibit unwanted phenomena which are related to the mesa edge (side face). A parasitic diode with a lower use voltage than in the central region of the LED chip may form at the mesa edge. Especially in InGaAlP chips, there may be an increased recombination rate at the mesa edge on account of diffusion. On account of the parasitic diode, a non-radiating leakage current and/or an injection of charge carriers (especially at low currents) may arise at the mesa edge. This phenomenon is a problem for small LED chips in particular, since these have a very high perimeter to area ratio. The current feed of the parasitic diode depends strongly on the manufacturing processes of the LED chips, which act on the mesa edge. It is assumed that charges at the mesa edge or layers on the mesa edge (e.g., passivation layer) in particular have a significant influence on the current feed of the parasitic diode. Electric fields and instances of band bending form in the semiconductor in the region of the mesa edge, and these lead to the parasitic diode being opened or closed. Thus, the parasitic diode can be opened or closed by charge transfers.

The patent application WO 2018/192879 A1 shows that an edge field generation device additionally applied to the mesa edge of an LED chip renders the parasitic diode manipulable, as a result of which the current flow and the recombination rate at the mesa edge is rendered controllable. Among other things, the concept of assigning a common edge field generation device to a plurality of semiconductor chips such that a simultaneous suppression of the current flow in the respective edge regions is rendered possible for all these semiconductor chips, for example by actuating the common edge field generation device. The use of a common edge field generation device for a plurality of semiconductor chips is advantageous in view of the manufacturing outlay for such a component.

According to at least one embodiment, the active zone of each semiconductor chip extends over the entire semiconductor layer sequence. In this case, structure and material composition of the active zone may be not altered or varied in targeted fashion. In particular, the active zone directly at the side faces is grown in exactly the same way as in an inner region of the semiconductor layer sequence. That is to say, purely from the point of view of the structure of the active zone, no difference can be identified between the edge region and other regions of the active zone.

According to at least one embodiment, each semiconductor chip is configured to be operated with low current densities and/or in the small current range. In a non-limiting embodiment, a mean current density in the active zone is no more than 100 A/cm$^2$ or 50 A/cm$^2$ or 10 A/cm$^2$ or 1 A/cm$^2$.

According to at least one embodiment, the semiconductor chips are arranged at a distance from one another on the carrier. That is to say, interstices are formed between the semiconductor chips. Consequently, facing side faces of two adjacent semiconductor chips are spaced apart from one another. By way of example, the distance between the side faces of adjacent semiconductor chips is at least 1 μm or at least 5 μm and/or no more than 100 μm or no more than 50 μm. By way of example, the semiconductor chips are arranged on grid points of a rectangular grid.

According to at least one embodiment, the common edge field generation device of the semiconductor chips of the first group comprises or consists of a contiguous electrode. The contiguous electrode is formed from an electrically conductive material. By way of example, the specific resistance of the contiguous electrode to a current flow in a direction parallel to the side face is no more than 1.108 Ω·cm or no more than 1.104 Ω·cm or no more than 1 Ω·cm. The specific resistance is specified at room temperature.

The contiguous electrode can be formed in one piece. By way of example, the contiguous electrode comprises or consists of: a metal, transparent conductive oxide, semiconductor material such as silicon, conductive glass. In a non-limiting embodiment, the contiguous electrode is electrically insulated from the n-electrodes and the p-electrodes of the semiconductor chips, for example by way of dielectric layers. Thus, the contiguous electrode is actuatable independently of the n-electrodes and the p-electrodes. When used as intended, the contiguous electrode is for example at a different potential to the n- and p-electrodes of the actuated semiconductor chips.

According to at least one embodiment, the contiguous electrode of each semiconductor chip of the first group covers the passivation layer at least level with the active zone. There, the electrode may be in direct contact with the respective passivation layer. In a plan view of each of the side faces of each semiconductor chip of the first group, the contiguous electrode may cover the corresponding side face to at least 50% or at least 75% or in full. When viewed in a plan view, the contiguous electrode may surround each semiconductor chip from the first group like a frame.

Semiconductor chips of the first group can be arranged next to one another. In this case, the contiguous electrode may extend within the interstices between the semiconductor chips of the first group. When viewed in a top view on the carrier, the contiguous electrode for example has the form of a mesh, with one of the semiconductor chips from the first group being arranged within each hole of the mesh.

According to at least one embodiment, interstices between semiconductor chips of the first group are at least partially filled with an electrically conductive material. The contiguous electrode comprises or consists of the electrically conductive material.

The interstices between semiconductor chips of the first group may be largely filled with the electrically conductive material, for example to at least 50% or at least 75% or at least 90%. In this case, the electrically conductive material may nestle against the semiconductor chips of the first group in interlocking fashion. By way of example, the electrically conductive material terminates flush with the semiconductor layer sequences of the semiconductor chips in the direction away from the carrier.

According to at least one embodiment, the common edge field generation device comprises one or more electrostatic layers at the active zones. The electrostatic layers may be contiguous in each case. A charge such as a surface charge is generable on the side faces of the semiconductor layer sequences of the semiconductor chips of the first group, such as in permanent fashion, by way of the at least one electrostatic layer. The charge or surface charge can be generated directly in the semiconductor layer sequences or else in the passivation layer, or may be limited to the electrostatic layer. The charge can also be present in volume, which is also referred to as bulk. Moreover, the charge may be generated at an interface between the electrostatic layer and the passivation layer and/or at an interface between the passivation layer and the semiconductor layer sequence. The electrostatic layer can be electrically insulated to the outside. The electrostatic layer may have a layer stack. Overall, the electrostatic layer may be electrically neutral.

According to at least one embodiment, the edge regions of the semiconductor chips, in which the current flow is set or regulated or suppressed on account of the edge field generation device, each have a mean width of at least 0.1 µm or 0.5 µm or 1 µm or 1.5 µm, as seen in a plan view. Alternatively or in addition, the mean width in each case is no more than 10 µm or 5 µm or 3 µm. The current flow being suppressed means, for example, that the current flow in the edge regions is no more than 10% or 1% of an intended current intensity for light production.

According to at least one embodiment, a current density in the edge regions of each semiconductor chip has the same value as in the central regions of the active zones on account of the edge field generation device. In particular, this applies with a tolerance with a factor of no more than 3 or 2 or 1.5.

According to at least one embodiment, a quotient of an overall area of the active zone and an area of the edge region is permanently or intermittently at least 1 or 2 or 5 when seen in a plan view during operation as intended of each semiconductor chip with an assigned edge field generation device.

Alternatively or in addition, this quotient is no more than 50 or 20 or 10. Expressed differently, the edge region takes up a comparatively large proportion of the active zone during operation as intended.

According to at least one embodiment, the semiconductor chips of the first group are each configured to emit electromagnetic radiation in a first wavelength range. By way of example, the semiconductor chips of the first group emit blue light during operation as intended. By way of example, the semiconductor chips of the first group are semiconductor chips based on a nitride compound semiconductor material, in particular AlInGaN.

According to at least one embodiment, some of the semiconductor chips of the component are assigned to a second group. The semiconductor chips may be uniquely assigned to the respective groups.

According to at least one embodiment, the semiconductor chips of the second group are each configured to emit radiation in a second wavelength range that differs from the first wavelength range. By way of example, the semiconductor chips of the first group emit radiation with a global intensity maximum at a first wavelength and the semiconductor chips of the second group emit radiation with a global intensity maximum at a second wavelength. By way of example, the first and the second wavelength differ by at least 50 nm or at least 100 nm. In particular, the semiconductor chips of the first group and of the second group emit light of different colors. By way of example, the semiconductor chips of the second group are based on a phosphide compound semiconductor material and/or an arsenide compound semiconductor material. By way of example, the semiconductor chips of the second group each emit red and/or green light.

Further, there may also be a third group to which some semiconductor chips are assigned, the semiconductor chips of the third group emitting radiation in a third wavelength range that differs from the first and from the second wavelength range. By way of example, the semiconductor chips of the third group are based on an arsenide compound semiconductor material.

In a non-limiting embodiment, the semiconductor chips of the first group emit blue light, those of the second group emit green light and those of the third group emit red light. By way of example, the component comprises a plurality of pixels, each pixel being uniquely assigned at least one semiconductor chip from the first group, at least one semiconductor chip from the second group and at least one semiconductor chip from the third group.

According to at least one embodiment, the semiconductor chips from the first group are arranged on the carrier in alternation with the semiconductor chips from the second group. That is to say at least one semiconductor chip of the second group is arranged between two semiconductor chips of the first group and at least one semiconductor chip of the first group is arranged between two semiconductor chips of the second group.

According to at least one embodiment, the semiconductor chips from the second group do not have an edge field generation device. In particular, the passivation layers of the semiconductor chips of the second group are then exposed to the outside and/or are not covered by an electrically conductive material on the sides of the passivation layer facing away from the semiconductor layer sequence. In particular, the semiconductor chips of the second group are not assigned the same edge field generation device as the semiconductor chips of the first group.

According to at least one embodiment, a common edge field generation device is assigned to the semiconductor chips of the second group. The common edge field generation device is arranged level with the active zone on a side of the passivation layer facing away from the semiconductor layer sequence for each semiconductor chip of the second group. The common edge field generation device of the semiconductor chips of the second group can have a similar structure to the common edge field generation device of the semiconductor chips of the first group. In particular, all features that have been disclosed in conjunction with the common edge field generation device of the semiconductor chips of the first group are also disclosed for the common edge field generation device of the semiconductor chips of the second group.

According to at least one embodiment, the common edge field generation device of the semiconductor chips of the first group is electrically insulated from the common edge field generation device of the semiconductor chips of the second group. The edge field generation devices of the first group and of the second group are therefore not related to one another and are different from one another. In the case where the edge field generation devices each comprise or consist of a contiguous electrode, the two contiguous electrodes are electrically insulated from one another and contactable independently of one another. In the case where the semiconductor chips of the first group and of the second group differ in terms of their structure, for example in terms of the material of the semiconductor layer sequence, the current flow in the edge zones can advantageously be adjusted separately for each group, consequently allowing differences in the semiconductor materials to be taken into account.

According to at least one embodiment, the passivation layers of the semiconductor chips of the first group have different thicknesses than the passivation layers of the semiconductor chips of the second group. By way of example, the thicknesses of the passivation layers of the semiconductor chips of the first group deviate by at least 10% or at least 25% or at least 50% from the corresponding thicknesses of the semiconductor chips of the second group. Thicknesses mean in particular the mean thicknesses in the region of the side faces. Alternatively or in addition, the passivation layers of the semiconductor chips of the first group may have a different permittivity to the passivation layers of the semiconductor chips of the second group. By way of example, the permittivity of the passivation layers of the first group differs by at least 10% or at least 25% or at least 50% from the permittivity of the passivation layers of the second group.

According to at least one embodiment, the passivation layers of the semiconductor chips each have a mean thickness of at least 5 nm or 10 nm or 20 nm or 50 nm. Alternatively or in addition, the mean thicknesses of the passivation layers are at most 1 μm or 500 nm or 250 nm in each case. In particular, the passivation layer defines a distance between the edge field generation device and the side faces of the semiconductor layer sequence. Consequently, the edge field generation device may be very close to the side faces on the active zone.

According to at least one embodiment, the same common edge field generation device is assigned to the semiconductor chips of the first group and to the semiconductor chips of the second group. In the case where this edge field generation device comprises or consists of a contiguous electrode, this contiguous electrode then may extend within the interstices between all semiconductor chips of the first and second group, and covers the passivation layers of the semiconductor chips of the first and second group level with the active zones. In particular, the edge field generation device of all semiconductor chips of the first and second group is at the same potential. Thus, the edge field generation device can only be operated simultaneously for all semiconductor chips of the first and second group.

A common edge field generation device for the semiconductor chips of the first group and the second group is advantageous since this can keep the production outlay and the control outlay particularly low. In order nevertheless to be able to take account of the different materials of the semiconductor chips of the first group and second group and to be able to adapt the current flow in the respective edge zones individually to the material conditions of the semiconductor chips, the passivation layers for the semiconductor chips of the first and the second group are for example chosen with different thicknesses and/or with different permittivity values. As a result, the electric fields in the semiconductor chips of the different groups have different magnitudes even though all semiconductor chips are surrounded by the same contiguous electrode.

According to at least one embodiment, the carrier comprises an integrated circuit for individual and independent actuation of the semiconductor chips. By way of example, the carrier is an IC chip. In particular, the carrier comprises transistors, for example thin-film transistors. Each semiconductor chip can be uniquely assigned at least one of the transistors. Transistors serve to activate and deactivate the semiconductor chips.

According to at least one embodiment, the associated semiconductor layer sequence of each semiconductor chip is arranged between the n-electrode and the p-electrode. By way of example, the n- and p-electrodes are applied to the semiconductor layer sequences in planar fashion.

According to at least one embodiment, the semiconductor chips are thin-film chips in each case. That is to say, a growth substrate has been removed from the semiconductor layer sequence.

According to at least one embodiment, either the n-electrode or the p-electrode of each semiconductor chip faces the carrier and is electrically conductively connected to a connection face of the carrier. In turn, the connection faces of the carrier may be electrically conductively connected to the assigned transistors. By way of example, the connection faces are metallizations of the carrier.

According to at least one embodiment, the electrodes of the semiconductor chips facing away from the carrier, that is to say either the n-electrodes or the p-electrodes, are in each case electrically conductively interconnected by way of a transparent, electrically conductive layer. By way of example, the transparent electrically conductive layer consists of or comprises a TCO such as indium tin oxide, which is abbreviated ITO. The transparent, electrically conductive layer may be electrically insulated from the edge field generation device or devices.

An operating method for operating an optoelectronic component as described herein is specified next. In this case, an electric field is generated intermittently or permanently in the peripheral edge regions of the active zones of the semiconductor chips of the first group by means of the common edge field generation device, the electric field controlling a current flow through the semiconductor layer sequences in the edge regions during operation. If the optoelectronic component comprises a second group with assigned semiconductor chips and with an assigned edge field generation device, an electric field is generated intermittently or permanently in the edge regions of the active zones of the semiconductor chips of the second group by means of the edge field generation device assigned to the second group, and a current flow through the semiconductor layer sequences in the edge regions is controlled thereby.

According to at least one embodiment of the operating method, the edge field generation device comprises the contiguous electrode. A voltage of at least 4 V or 5 V or 10 V or 15 V or 30 V or 60 V is intermittently or permanently applied to the contiguous electrode. In particular, this voltage difference is applied across the contiguous electrode of the edge field generation device and the p-electrodes or the n-electrodes of the semiconductor chips. In a non-limiting embodiment, the contiguous electrode is brought to a potential that is more negative than that of the n-electrodes of the semiconductor chips.

According to at least one embodiment, the edge regions in each case intermittently or permanently adopt at least 5% or 25% or 50% or 75% of the active zones when seen in a plan view. It is possible that, when seen in the plan view, the edge regions in each case intermittently comprise the entire active zone.

The method for producing an optoelectronic component is e for specified next. In particular, the method is suitable producing an optoelectronic component as described herein. Therefore, all features disclosed in conjunction with the optoelectronic component are also disclosed for the production method, and vice versa.

According to at least one embodiment, the method comprises a step A), in which a plurality of optoelectronic semiconductor chips are applied to a carrier. The semiconductor chips are already singulated before step A), that is to say they are not contiguous. Each semiconductor chip comprises a semiconductor layer sequence having an n-doped layer, a p-doped layer and an active zone producing for radiation by means of electroluminescence between the p-doped layer and the n-doped layer. Further, each semiconductor chip comprises at least one side face which extends at an angle to the active zone and which delimits the semiconductor layer sequence in a lateral direction. Moreover, each semiconductor chip comprises a p-electrode and an n-electrode for electrically contacting the p-doped layer and the n-doped layer.

According to at least one embodiment, a respective passivation layer is arranged at the respective side face of the semiconductor layer sequence of the semiconductor chips in a step B) of the method. In this case, a dedicated passivation layer can be arranged on each semiconductor chip. Alternatively, the same, contiguous passivation layer is arranged on all semiconductor chips. Step B) can be carried out before or after step A).

According to at least one embodiment, the method comprises a step C), in which a common edge field generation device is formed for a first group of semiconductor chips. The common edge field generation device is arranged level with the active zone on a side of the passivation layer facing away from the semiconductor layer sequence for each semiconductor chip of the first group. Step C) may be carried out after steps A) and B). The edge field generation device is configured to generate an electric field at least intermittently in edge regions of the active zones such that a current flow through the semiconductor layer sequences is controllable in the edge regions while the semiconductor chips of the first group are in operation.

According to at least one embodiment, the formation of the edge field generation device comprises the filling of interstices between the semiconductor chips with an electrically conductive material. In this case, the electrically conductive material may be molded against the passivation layers in interlocking manner. In a non-limiting embodiment, the interstices are filled with the electrically conductive material at least up to the level of the active zones. The electrically conductive material subsequently forms a contiguous electrode of the edge field generation device. Initially, all interstices between the semiconductor chips can be filled with the electrically conductive material.

According to at least one embodiment, the electrically conductive material is removed from side faces of some semiconductor chips after the interstices have been filled. By way of example, no edge field generation device should be used for these semiconductor chips. The removal can be implemented by a patterning process with the aid of a mask. By way of example, the electrically conductive material is removed by etching.

BRIEF DESCRIPTION OF THE DRAWINGS

Further advantageous embodiments and developments of the optoelectronic component and of the method for producing an optoelectronic component emerge from the exemplary embodiments described below in conjunction with the figures. The same or similar elements or elements with the same effect have been provided with the same reference signs in the figures. The figures and the proportions of the elements depicted in the figures should not be considered as true to scale. Rather, individual elements, especially layer thicknesses, may be depicted in exaggerated fashion, for better presentability and/or for an improved understanding.

In the figures:

FIGS. 8, 11, 14, 16 and 18 show different exemplary embodiments of the optoelectronic component in cross-sectional views and in a plan view.

FIGS. 1 to 8 show a first exemplary embodiment of the method. A carrier 8 is provided in the first position of FIG. 1. The carrier 8 comprises a plurality of connection faces 80, which for example are each formed from a metal and are initially exposed. By way of example, the carrier 8 is a silicon carrier with an integrated circuit. Each of the connection faces 80 can be electrically conductively connected to a transistor of the integrated circuit.

DETAILED DESCRIPTION

Figure 2:
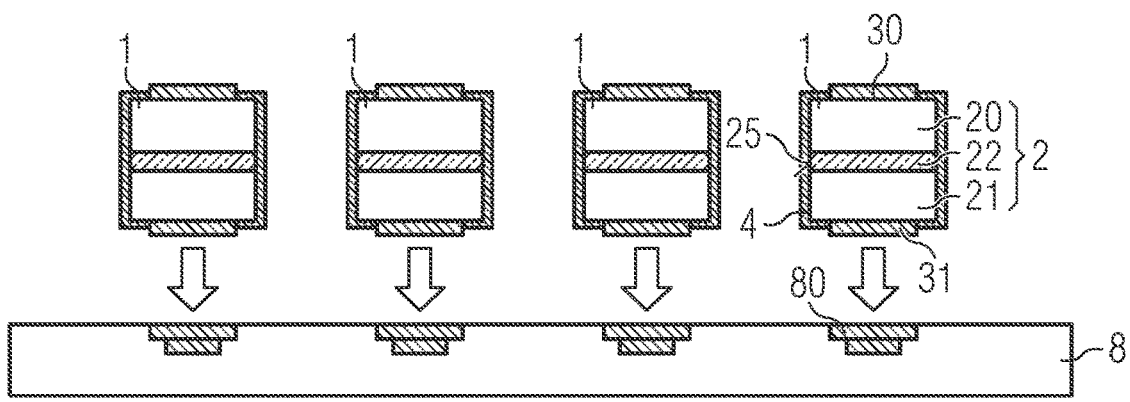

A plurality of mutually separated semiconductor chips 1 are provided and applied to the carrier 8 in the position of FIG. 2. Each semiconductor chip 1 comprises a semiconductor layer sequence 2 with a n-doped layer 20, a p-doped layer 21 and an active zone 22 between the n-doped layer 20 and the p-doped layer 22. In the lateral direction parallel to a plane of principal extent of the active zone 22, the semiconductor layer sequence 2 is delimited by side faces 25. The side faces 25 each extend at an angle to the active zone 22. The side faces 25 are formed from the semiconductor material of the semiconductor layer sequence 2. By way of example, the semiconductor material of the semiconductor layer sequence 2 is a nitride-based semiconductor material. By way of example, the semiconductor chips 1 are all AlInGaN chips.

The semiconductor chips 1 each have an n-electrode 30 and a p-electrode 31, by means of which the n-doped layer 20 and the p-doped layer 21 are electrically contacted. The semiconductor layer sequences 2 are each arranged between the electrodes 30, 31. Charge carriers are fed via the electrodes 30, 31 during the operation of a semiconductor chip 1, said charge carriers recombining in the active zone 22 and generating electromagnetic radiation as a result. It is evident from FIG. 2 that the semiconductor chips 1 are each applied to the carrier 8 with the p-electrode 31 leading. However, it would likewise also be conceivable to apply the semiconductor chips to the carrier with the n-electrodes 30 leading.

It is further evident from FIG. 2 that the semiconductor chips 1 each have a passivation layer 4. In the present case, the passivation layers 4 cover the side faces 25 of the semiconductor chips 1 in full. In particular, the passivation layers 4 are applied directly to the side faces 25. By way of example, the passivation layers 4 respectively are layers made of $SiO_2$ or SiN.

Figure 3:
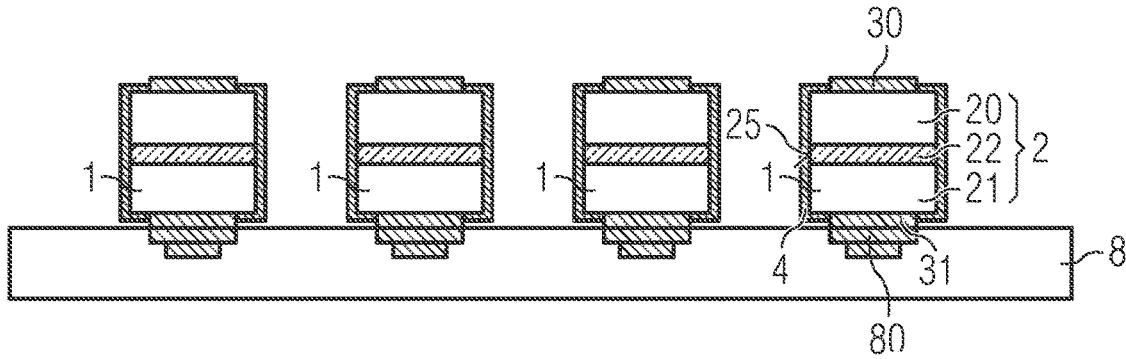

The position of FIG. 3 shows how the semiconductor chips 1 are finally applied to the carrier 8. In particular, the p-electrodes 31 are in each case electrically conductively connected to a connection face 80 in the process.

Figure 4:
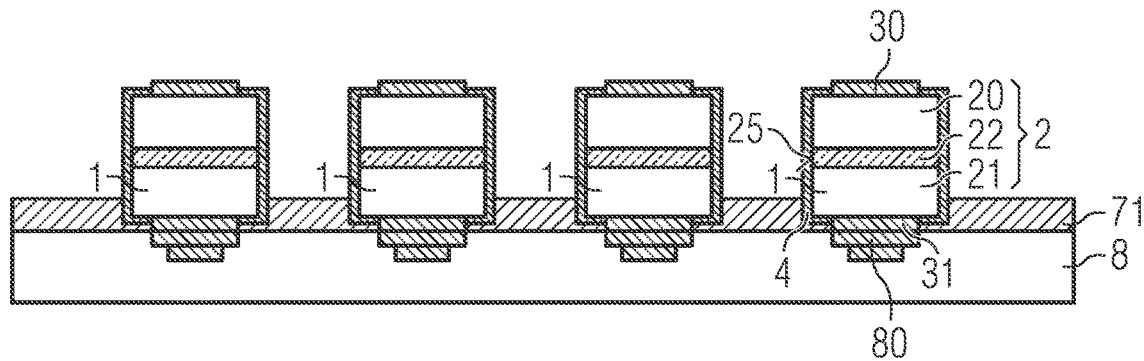

FIG. 4 shows a fourth position in the method. The carrier 8 is now covered by a dielectric layer 71 in the interstices between the semiconductor chips 1, said dielectric layer for example being able to be formed from a glass (a so-called spin-on glass). The dielectric layer 71 is intended to prevent a short circuit between the p-electrodes 31/connection faces 80 and the materials subsequently applied.

Figure 5:
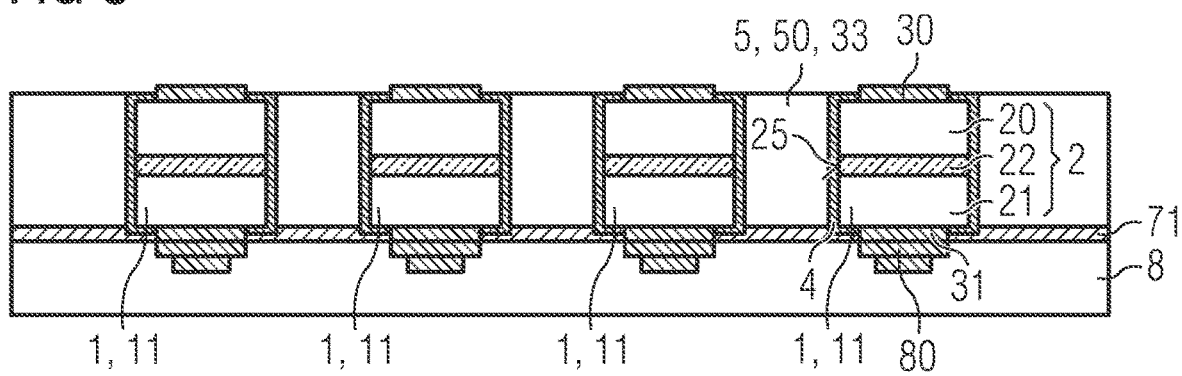

An edge field generation device 5 is generated in interstices between the semiconductor chips 1 in the position of FIG. 5. The edge field generation device 5 is assigned to all semiconductor chips 1 of FIG. 5. The semiconductor chips 1 shown in FIG. 5 form a first group 11 of semiconductor chips 1.

To generate at the edge field generation device 5, an electrically conductive material 50 was filled into the interstices. The electrically conductive material 50 surrounds the semiconductor chips 1 in interlocking fashion and is in direct mechanical contact with the passivation layers 4 level with the active zones 22. The electrically conductive material 50 forms a contiguous electrode 33, which is electrically insulated both from the n-electrodes 30 and from the p-electrodes 31 of the semiconductor chips 1 and hence a voltage is able to be applied separately thereto. By way of example, the electrically conductive material 50 is an electrically conductive glass (spin-on glass) or silicon applied by sputtering.

Figure 6:
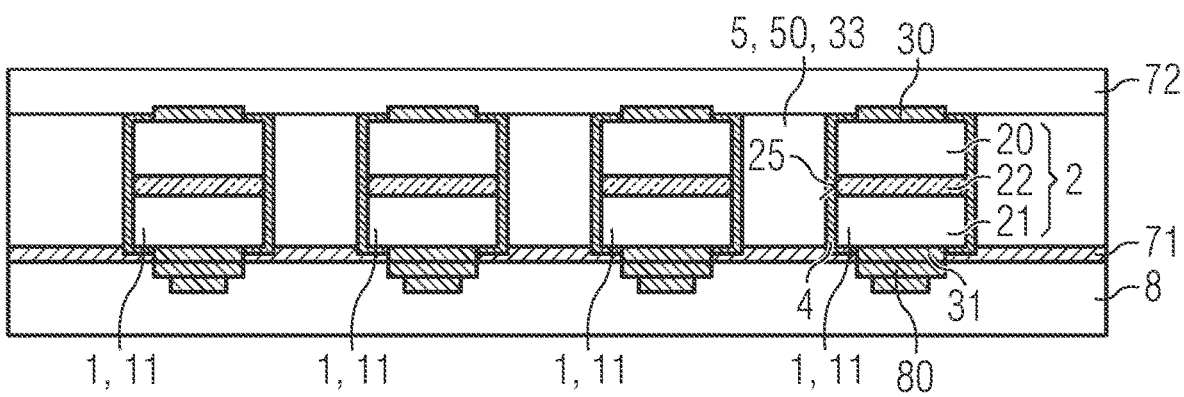

FIG. 6 shows a sixth position of the method in which a further dielectric layer 72 is applied to the semiconductor chips 1 and to the electrically conductive material 50. By way of example, the dielectric layer 72 is initially formed in contiguous fashion. By way of example, the dielectric layer 72 was applied by means of atomic layer deposition (ALD) or chemical vapor deposition (CVD).

Figure 7:
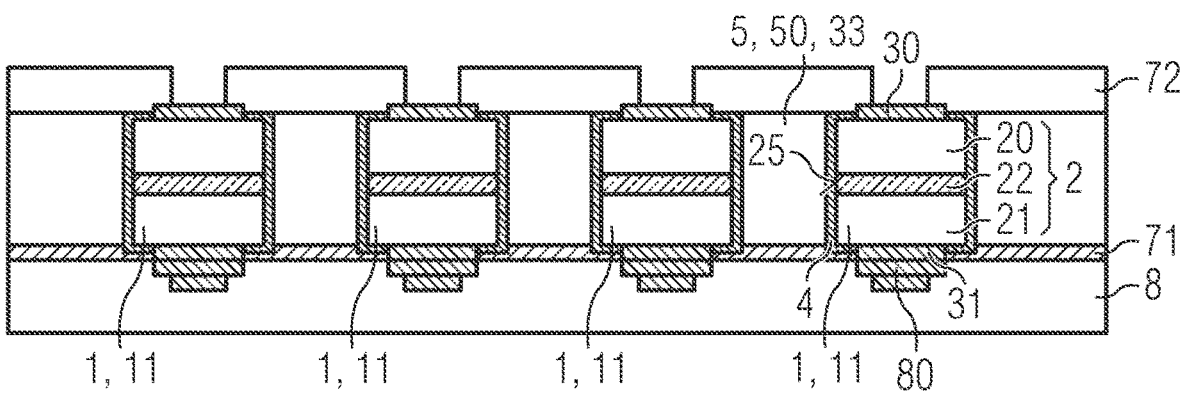

FIG. 7 shows a seventh position in the method, in which the dielectric layer 72 is opened in the region of the n-electrodes 30. By way of example, holes are introduced into the dielectric layer 72.

Figure 8:
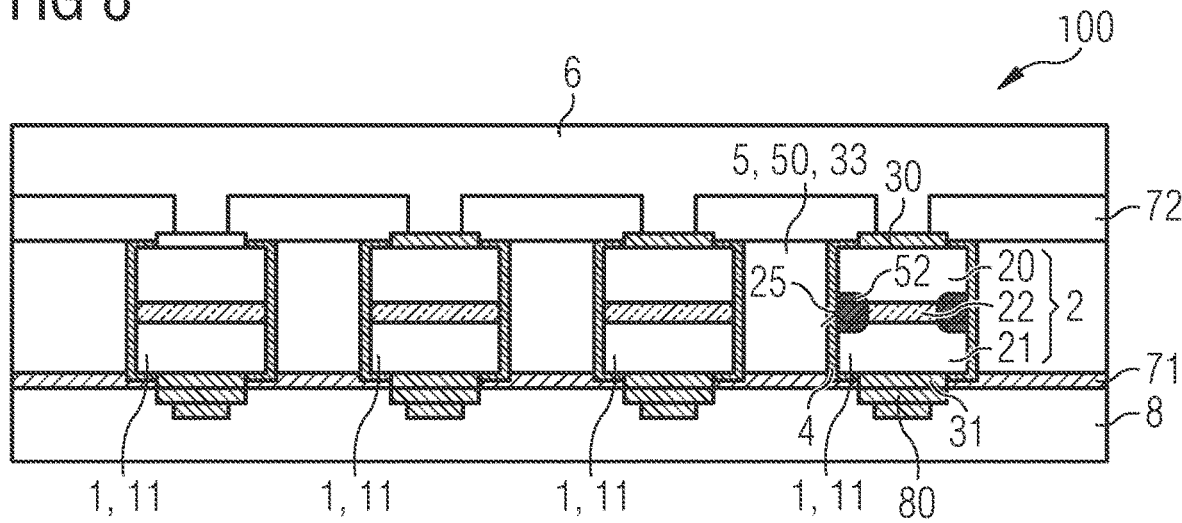

FIG. 8 shows a position in the method in which a transparent, electrically conductive layer 6 has been applied. By way of example, the layer 6 is an ITO layer. The layer 6 has been applied to the dielectric layer 72, has a contiguous form and fills the openings in the dielectric layer 72. The layer 6 is electrically conductively connected to the n-electrodes 30 within the openings.

FIG. 8 shows an exemplary embodiment of the optoelectronic component 100 at the same time. During the operation of the semiconductor chips 1, electromagnetic radiation is generated in the active zones 22 and can be output-coupled, for example via the transparent layer 6. The semiconductor chips 1 are actuatable individually and independently of one another via the carrier 8. During operation, the contiguous electrode 33 of the edge field generation device 5 is at a different potential to the electrodes 30, 31 of the semiconductor chips 1. In particular, the contiguous electrode 33 is provided with such a potential that an electric field is generated in edge regions 52 of the active zones 22. This controls a current flow through the semiconductor layer sequences 2 and a charge carrier recombination in the edge regions 52. By way of example, the generated electric field results in charge carriers within the semiconductor layer sequence 2 being pushed out of the edge regions 52 such that the conductivity of the semiconductor layer sequence 2 is reduced there.

In the exemplary embodiment of FIG. 8, all semiconductor chips 1 of the component 100 are assigned to the first group 11. By way of example, all semiconductor chips 1 emit electromagnetic radiation within the same wavelength range during use as intended. By way of example, all semiconductor chips 1 emit blue light.

Figure 9:
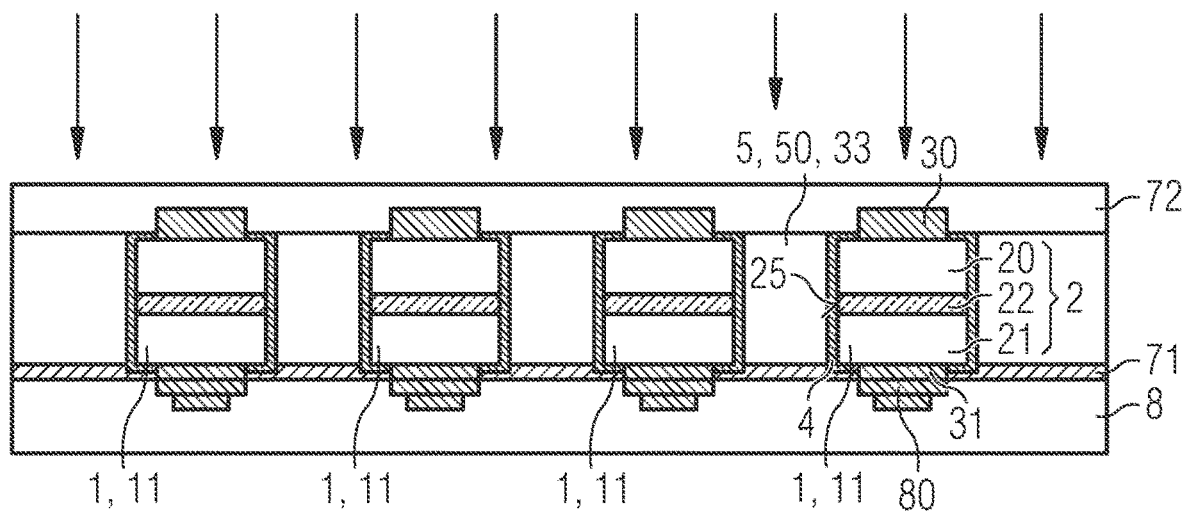
Figure 10:
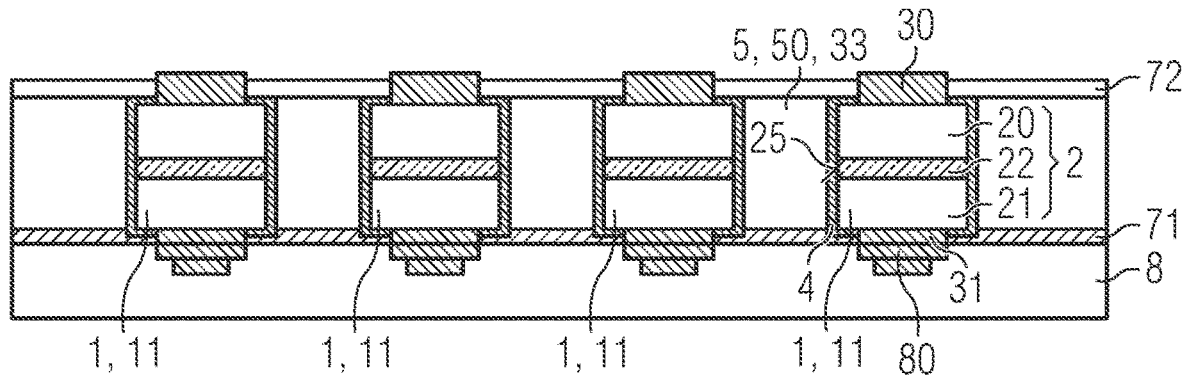
Figure 11:
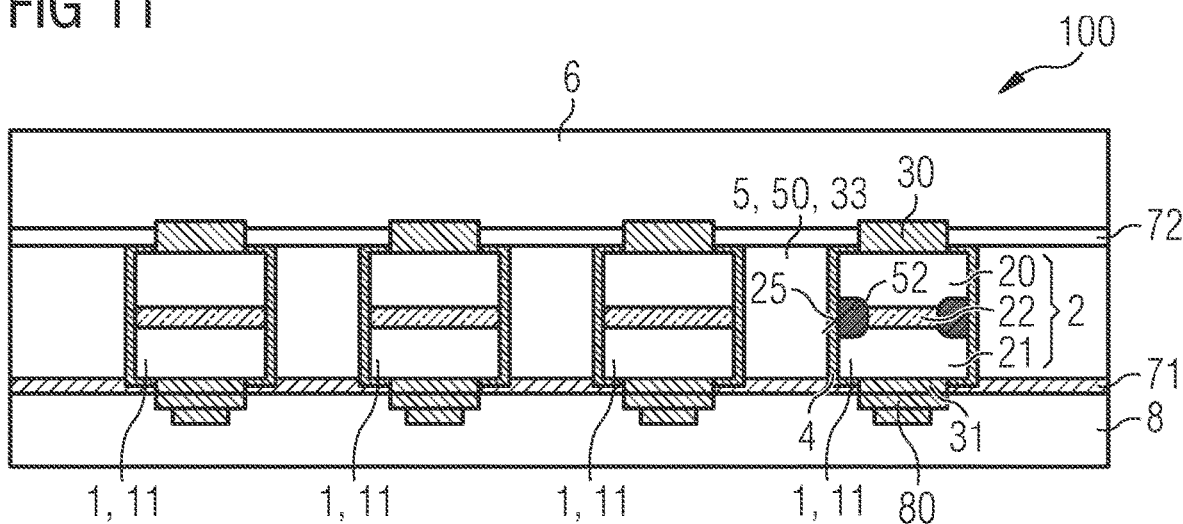

FIGS. 9 to 11 show positions in a second exemplary embodiment of the method. By way of example, the same steps as in the first exemplary embodiment were carried out in this exemplary embodiment, up to and including the step of applying the further dielectric layer 72. However, unlike in FIG. 7, no openings are introduced into the dielectric layer 72 in FIG. 9; instead, the dielectric layer 72 is etched back over its entire area, for example by dry chemical or wet chemical etching.

As is evident from FIG. 10, the dielectric layer 72 is etched back until the n-electrodes 30 of the semiconductor chips 1 are exposed.

FIG. 11 shows the finished optoelectronic component 100 after a transparent, electrically conductive layer 6 was once again applied to the dielectric layer 72 and the n-electrodes 30.

Figure 1:
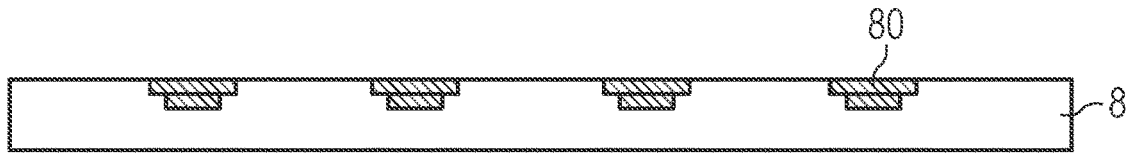
FIGS. 1 to 15, 17 and 18 show different positions in exemplary embodiments of the method for producing an optoelectronic component.
Figure 12:
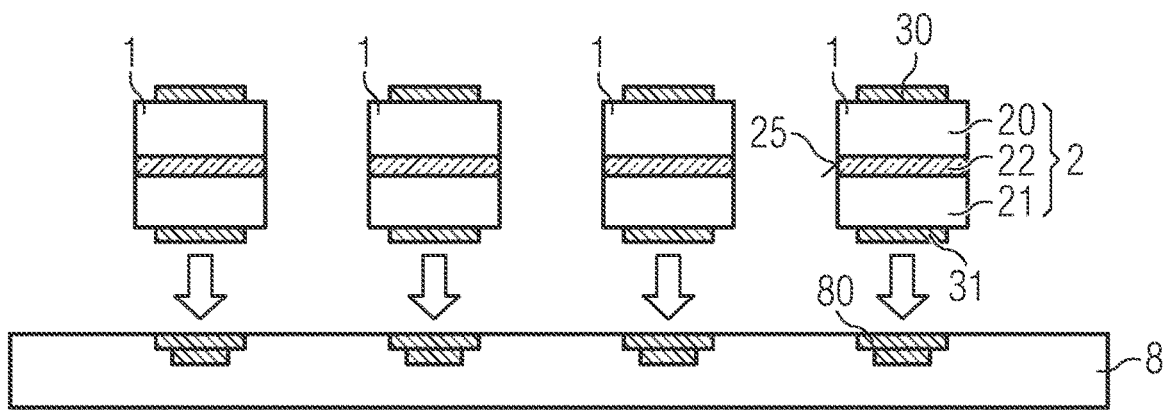
Figure 13:
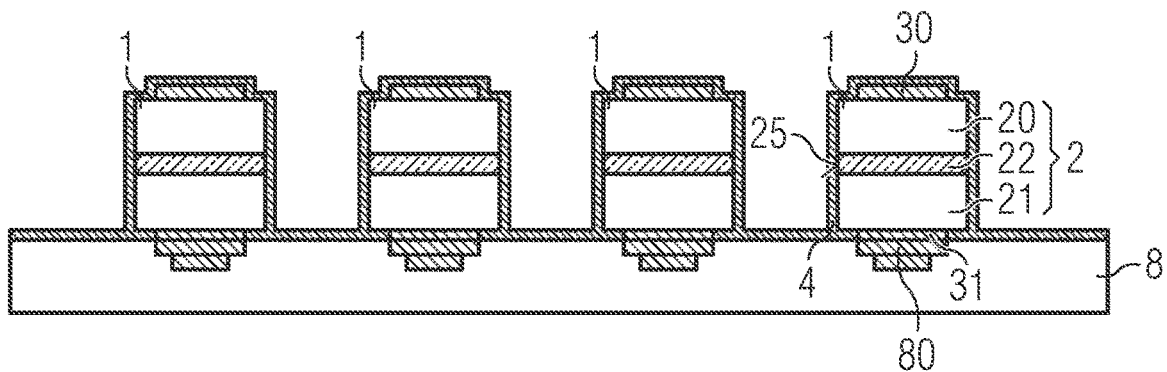
Figure 14:
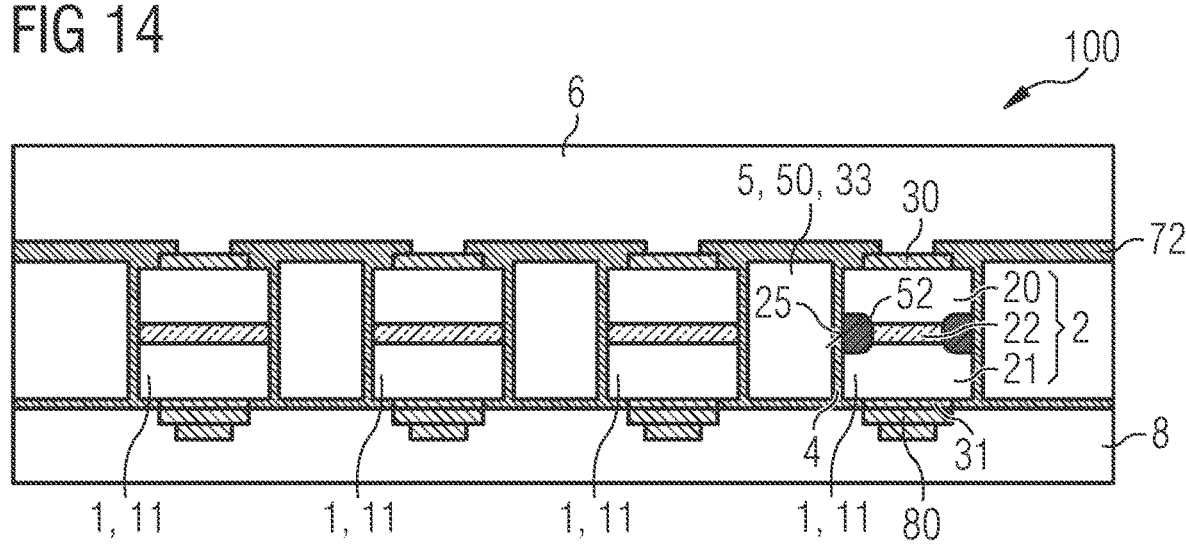

FIGS. 12 to 14 show a third exemplary embodiment of the method on the basis of positions in the method. In FIG. 12, a carrier 8 is once again initially provided, said carrier for example being chosen like the carrier 8 from FIG. 1. Optoelectronic semiconductor chips 1 are applied to the carrier 8. In contrast to the semiconductor chips 1 from the positions in FIGS. 2 and 3, the semiconductor chips 1 in this case do not yet have a passivation layer on the side faces 25 of the semiconductor layer sequences 2 upon application.

In the position in FIG. 13, the semiconductor chips 1 are mounted on the carrier 8 and electrically conductively connected to the carrier 8. The semiconductor chips 1 were coated with a passivation layer 4 following the mounting and electrically conductive connection. The latter was deposited by means of ALD, for example. As a result of subsequently applying the passivation layer 4, the thickness of the passivation layer 4 can advantageously be subsequently adjusted and adapted to match the required electric fields generated by the edge field generation device. Moreover, it is possible to dispense with the step of applying the dielectric layer 71 since the passivation layer 4 is in this case also applied to the region of the interstices on the carrier 8 and insulates the p-contacts 31 from the edge field generation device 5.

FIG. 14 shows a position in the third exemplary embodiment of the method in which the optoelectronic component 100 has been completed. By way of example, the same steps as also carried out in the first exemplary embodiment of the method were carried out after the passivation layer 4 was formed.

Figure 15:
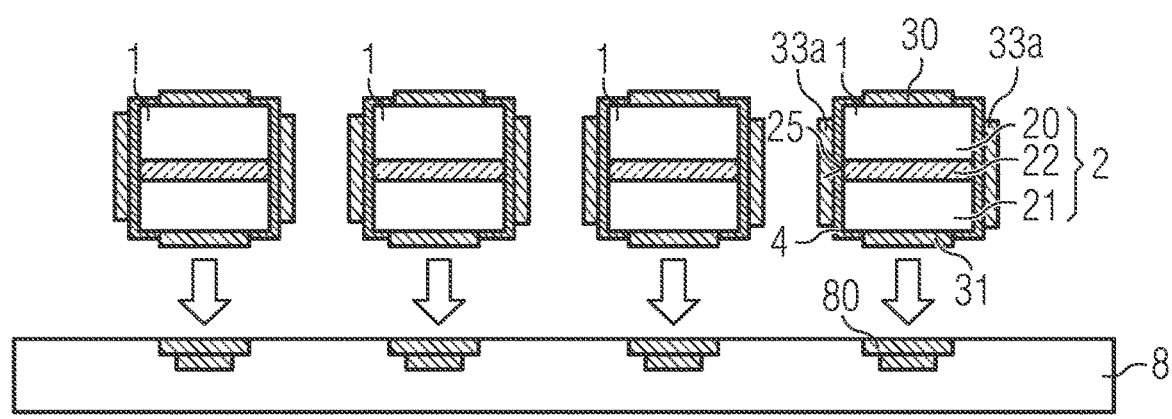

FIG. 15 shows a position in a fourth exemplary embodiment of the method. Like in the position in FIG. 2 of the first exemplary embodiment, semiconductor chips 1 which have already been covered by a passivation layer 4 on the side faces 25 of the semiconductor layer sequence 2 are applied to the carrier 8. In addition, the semiconductor chips 1 in this case each have a further electrode 33a on the sides of the passivation layer 4 facing away from the semiconductor layer sequence 2. The further electrodes 33a of the individual semiconductor chips 1 are then electrically interconnected, for example by filling the electrically conductive material 50, such that a contiguous electrode 33 arises again.

Figure 16:
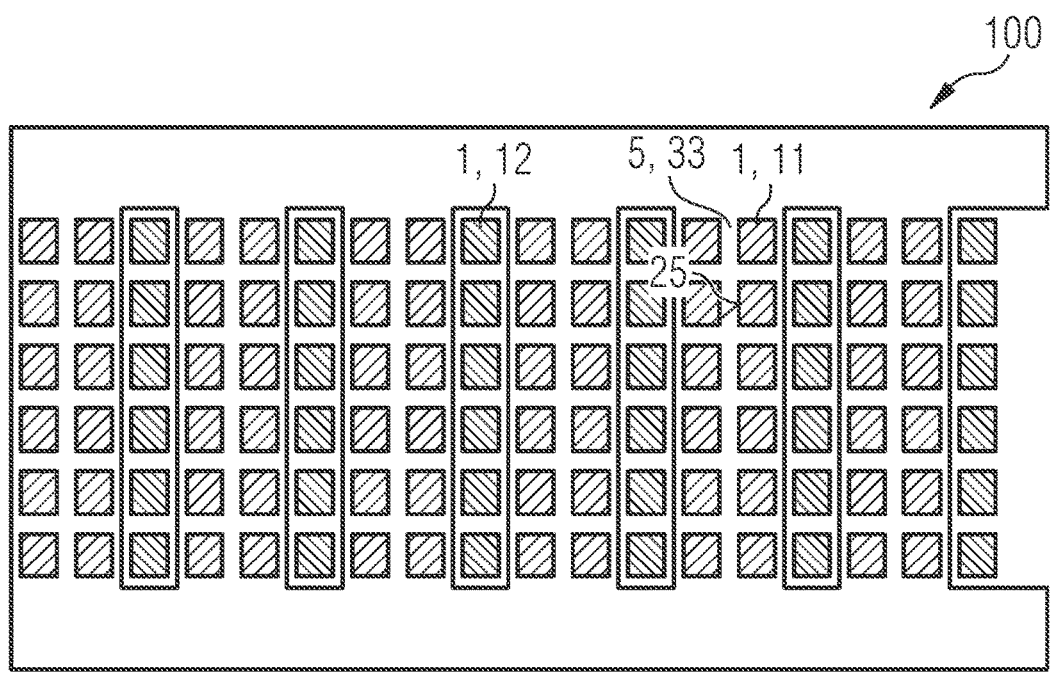

FIG. 16 shows an exemplary embodiment of the optoelectronic component 100 in a plan view. In this case, the optoelectronic component 100 comprises a first group 11 and a second group 12, which are each assigned a plurality of semiconductor chips 1. The semiconductor chips 1 belonging to different groups are depicted with different hatching.

The semiconductor chips 1 of the first group 11 are arranged in alternation with the semiconductor chips 1 of the second group 12. A common edge field generation device 5 in the form of a contiguous electrode 33 is assigned to the semiconductor chips 1 of the first group 11, for example as was explained in conjunction with the preceding figures. It is evident that the contiguous electrode 33 covers only the side faces 25 of the semiconductor chips 1 of the first group 11. The contiguous electrode 33 is spaced apart from the side faces 25 of the semiconductor chips 1 of the second group 12, for example by a gas-filled interstice. The contiguous electrode 33 forms a mesh around the semiconductor chips 1 of the first group 11.

By way of example, the semiconductor chips 1 of the first group 11 are blue-emitting semiconductor chips. By way of example, the semiconductor chips 1 of the second group 12 are red- or green-emitting semiconductor chips.

Figure 17:
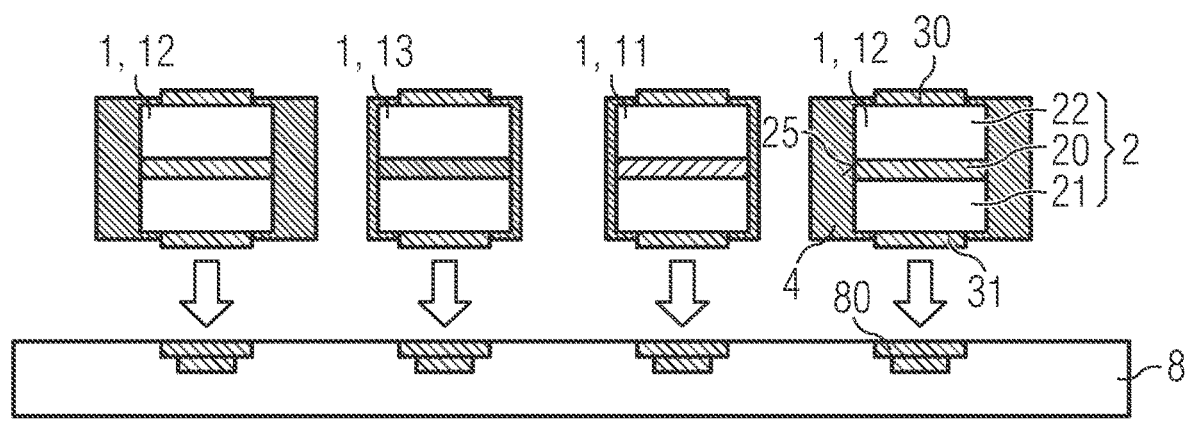

FIG. 17 shows a position in a fifth exemplary embodiment of the method. Here, a similar position to that of FIG. 2 is shown. However, in to figure contrast 2, different optoelectronic semiconductor chips 1 are provided here and are assigned to different groups 11, 12, 13. The semiconductor chips the first group 11 are for example blue-emitting 1 from t semiconductor chips, the semiconductor chips 1 from the second group 12 are for example red-emitting semiconductor chips and the semiconductor chips 1 from the third group 13 are for example green-emitting semiconductor chips.

Depending on the group, the passivation layer 4 on the side faces 25 of the semiconductor chips 1 is chosen to have different thicknesses. Alternatively or in addition, the passivation layers 4 could be formed from materials with different permittivity values, depending on the group.

Figure 18:
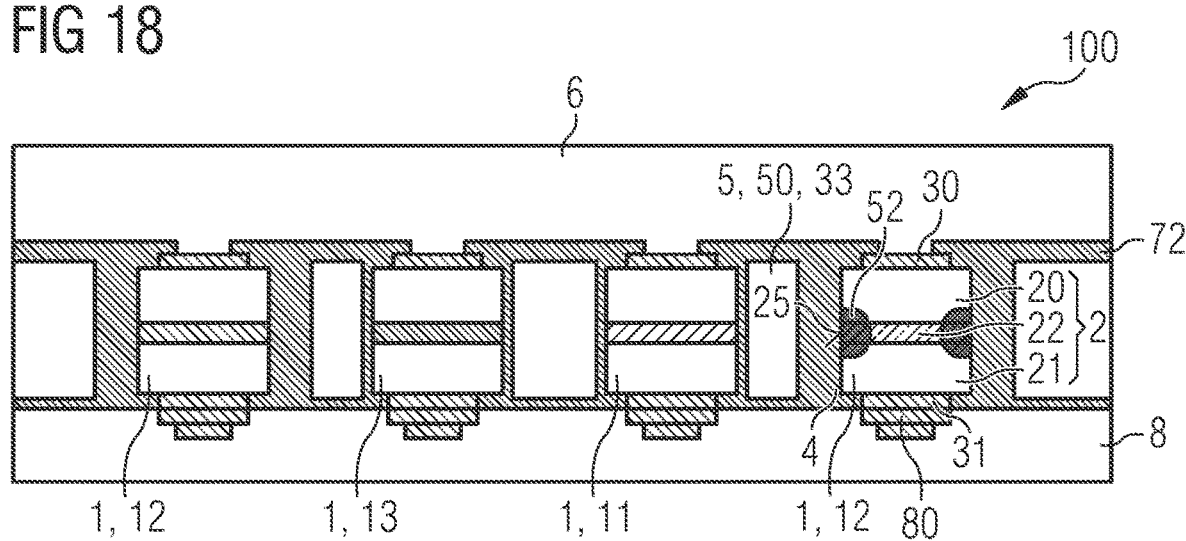

FIG. 18 shows a position in the method after the optoelectronic component 100 has been completed. In this case, the same edge field generation device 5 in the form of a contiguous electrode 33 made of an electrically conductive material 50 is assigned to all semiconductor chips 1 of the three groups 11, 12, 13. Thus, the edge field generation device 5 covers all side faces 25 of all semiconductor chips 1. Once again, the contiguous electrode 33 can be provided with a different potential to that of the electrodes 30, 31.

The electric fields for controlling the current flow in the edge regions 25, which are generated in the edge regions 25 of the semiconductor chips 1, are different for the semiconductor chips 1 of the various groups 11, 12, 13. This is caused by the different thicknesses of the passivation layers 4. Thus, the current flows in the edge regions 24 of the semiconductor chips can be controlled differently depending on the assigned group even though all semiconductor chips 1 are assigned the same edge field generation device 5.

The invention is not restricted to the exemplary embodiments by the description on the basis thereof. Rather, the invention comprises any novel feature and any combination of features, which includes in particular any combination of features in the claims, even if these features or this combination itself is not explicitly specified in the claims or exemplary embodiments.

LIST OF REFERENCE SYMBOLS

1 Optoelectronic semiconductor chip
2 Semiconductor layer sequence
4 Passivation layer
5 Edge field generation device
6 Transparent, electrically conductive layer
8 Carrier
11 First group
12 Second group
13 Third group
20 n-conductive layer
21 p-conductive layer
22 Active zone
25 Side face
30 n-electrode
31 p-electrode
33 Contiguous electrode
33a Further electrode
52 Edge region
71 Dielectric layer
72 Dielectric layer
80 Connection face
100 Optoelectronic component

The invention claimed is:

1. An optoelectronic component comprising:
a carrier
a plurality of individually and independently actuatable optoelectronic semiconductor chips arranged on the carrier with
each semiconductor chip comprising a semiconductor layer sequence having an n-doped layer, a p-doped layer, an active zone for producing radiation by means of electroluminescence between the p-doped layer and the n-doped layer and a side face which extends at an angle to the active zone and delimits the semiconductor layer sequence in a lateral direction, and a p-electrode and an n-electrode for electrically contacting the p-doped layer and the n-doped layer;
the semiconductor chips each having an electrically insulating passivation layer on the respective side face of the semiconductor layer sequence;
at least some of the semiconductor chips being assigned to a first group;
the semiconductor chips of the first group being assigned a common edge field generation device, the latter being arranged level with the active zone on a side of the passivation layer facing away from the semiconductor layer sequence for each semiconductor chip of the first group;
the edge field generation device being configured to generate an electric field at least intermittently in edge regions of the active zones such that a current flow through the semiconductor layer sequences is controllable in the edge regions while the semiconductor chips of the first group are in operation;
the semiconductor chips of the first group each being configured to emit electromagnetic radiation from a first wavelength range:
some of the semiconductor chips being assigned to a second group;
the semiconductor chips of the second group each being configured to emit radiation from a second wavelength range that differs from the first wavelength range;
the semiconductor chips of the second group being assigned a common edge field generation device, the latter being arranged level with the active zone on a side of the passivation layer facing away from the semiconductor layer sequence for each semiconductor chip of the second group;
the passivation layers of the semiconductor chips of the first group having different thicknesses than those of the semiconductor chips of the second group; and
the same common edge field generation device being assigned to the semiconductor chips of the first group and to the semiconductor chips of the second group.

2. The optoelectronic component as claimed in claim 1, wherein:
the semiconductor chips are arranged at a distance from one another on the carrier;
the common edge field generation device of the semiconductor chips of the first group comprises a contiguous electrode; and
the contiguous electrode of each semiconductor chip of the first group covers the passivation layer at least level with the active zones.

3. The optoelectronic component as claimed in claim 2, wherein:
interstices between semiconductor chips of the first group are at least partly filled with an electrically conductive material; and
the contiguous electrode comprises the electrically conductive material.

4. The optoelectronic component as claimed in claim 1, wherein semiconductor chips from the first group are arranged on the carrier in alternation with semiconductor chips from the second group.

5. The optoelectronic component as claimed in claim 1, wherein the semiconductor chips of the second group have no edge field generation device.

6. The optoelectronic component as claimed in claim 1, wherein:
the common edge field generation device of the semiconductor chips of the first group is electrically insulated from the common edge field generation device of the semiconductor chips of the second group.

7. The optoelectronic component as claimed in claim 1, wherein the carrier comprises an integrated circuit for individual and independent actuation of the semiconductor chips.

8. The optoelectronic component as claimed in claim 1, wherein;
the associated semiconductor layer sequence of each semiconductor chip is arranged between the n-electrode and the p-electrode; and
either the n-electrode or the p-electrode of each semiconductor chip faces the carrier and is electrically conductively connected to a connection face of the carrier.

9. The optoelectronic component as claimed in claim 8, wherein:
the electrodes of the semiconductor chips facing away from the carrier in each case are electrically conductively interconnected by way of a transparent, electrically conductive layer.

10. An operating method for operating an optoelectronic component as claimed in claim 1, wherein the method comprises:
generating an electric field intermittently or permanently in the edge regions of the active zones of the semiconductor chips of the first group and of the second group by the common edge field generation device; and
controlling a current flow through the semiconductor layer sequences in the edge regions during operation.

11. A method for producing an optoelectronic component as claimed in claim 1, wherein the method comprises:
applying a plurality of optoelectronic semiconductor chips to a carrier; wherein:
each semiconductor chip comprising a semiconductor layer sequence having an n-doped layer, a p-doped layer, an active zone for producing radiation by means of electroluminescence between the p-doped layer and the n-doped layer and a side face which extends at an angle to the active zone and delimits the semiconductor layer sequence in a lateral direction, and a p-electrode and an n-electrode for electrically contacting the p-doped layer and the n-doped layer;
applying a respective passivation layer to the respective side face of the semiconductor layer sequence of the semiconductor chips;
forming a common edge field generation device for a first group and a second group of semiconductor chips, the common edge field generation device being arranged level with the active zone on a side of the passivation layer facing away from the semiconductor layer sequence for each semiconductor chip of the first group and of the second group;
the edge field generation device being configured to generate an electric field at least intermittently in edge regions of the active zones such that a current flow through the semiconductor layer sequences is controllable in the edge regions while the semiconductor chips of the first group and of the second group are in operation.

12. The method as claimed in claim 11, wherein the formation of the edge field generation device comprises the filling of interstices between the semiconductor chips with an electrically conductive material.

13. The method as claimed in claim 12, wherein the electrically conductive material is subsequently removed from the side faces of some semiconductor chips.

* * * * *